United States Patent [19]

Hsu et al.

[11] Patent Number: 5,978,277
[45] Date of Patent: Nov. 2, 1999

[54] BIAS CONDITION AND X-DECODER CIRCUIT OF FLASH MEMORY ARRAY

[75] Inventors: Fu-Chang Hsu; Hsing-Ya Tsao, both of Taipei, Taiwan; Peter Wung Lee, Saratoga, Calif.

[73] Assignee: Aplus Flash Technology, Inc., Santa Clara, Calif.

[21] Appl. No.: 09/159,793

[22] Filed: Sep. 24, 1998

Related U.S. Application Data

[60] Provisional application No. 60/080,845, Apr. 6, 1998.

[51] Int. Cl.$^6$ ................................. G11C 16/04
[52] U.S. Cl. ..................... 365/185.29; 365/230.06; 365/185.11; 365/185.27; 365/218; 365/230.03
[58] Field of Search .................. 365/185.29, 230.06, 365/185.23, 230.03, 185.11, 185.18, 185.27, 218

[56] References Cited

U.S. PATENT DOCUMENTS

| | | | |
|---|---|---|---|
| 5,701,272 | 12/1997 | Brennan, Jr. ................... | 365/230.06 |
| 5,848,000 | 12/1998 | Lee et al. ........................ | 365/185.23 |
| 5,856,942 | 1/1999 | Lee et al. ........................ | 365/185.11 |

*Primary Examiner*—David Nelms
*Assistant Examiner*—Thong Le

[57] ABSTRACT

New bias conditions for flash memory cells and X-decoder circuits for providing the bias conditions. In an erasing operation, a positive high voltage is provided to the bulk and a negative high voltage is provided to the control gate for establishing a sufficient electric field to induce electron tunneling effect. In an operation for repairing a cell's threshold voltage, the biased voltages are reversed. A first X-decoder circuit structure is presented for supplying positive and negative high voltages to the memory cells for block erasing or repairing. The first X-decoder circuit structure has a plurality of X-decoder blocks each being constructed in a separated X-decoder well, and the memory cells are fabricated in a separate common array well. A second X-decoder circuit structure is presented to provide an appropriate bias condition for erasing or repairing a small sector of word lines. For the second X-decoder circuit structure, each memory block is fabricated in a separated array well. Separated X-decoder wells are constructed to provide voltages to the word lines of memory blocks. Every word line in a memory block has an X-decoder driver so that the word line can be erased or repaired individually. A new layout is also presented for the construction of the X-decoder circuits.

37 Claims, 8 Drawing Sheets

BIAS CONDITION AND X-DECODER CIRCUIT OF FLASH MEMORY ARRAY

This application claims the benefit of U.S. Provisional Application No. 60/080,845, Apr. 6, 1998.

FIELD OF THE INVENTION

The present invention relates to the design and circuit structure of a flash memory array, and more specifically to the bias condition of flash memory cells and the circuit structure of decoders for providing the bias conditions in a flash memory array.

BACKGROUND OF THE INVENTION

A conventional EPROM-type flash memory features a byte-programming and a block-erasing capability with each block containing a number of bytes. Because the data within a memory block can not be selected for erasure individually, a flash memory array has to erase the data of a whole block of memory cells, i.e., an erased block, and then program the new data byte by byte. The block erasing scheme, however, not only is inflexible but also has an undesirable problem called over-erasure that results from simultaneously erasing memory cells requiring different erasing time.

As is well known, it is very important for a flash memory device to provide efficient erasing and repairing operations without shortening the life of the device. Towards achieving this goal, different bias conditions to the cells in the memory array as well as improved decoder circuits for selecting word lines and providing appropriate bias conditions to the cells during erasing and repairing operations have been researched and pursued.

As shown in FIG. 1(a), a widely used erasing technique generally referred to as channel erasing applies a positive high voltage to the bulk (substrate) 101 of a memory cell and grounds its control gate 102. This bias condition builds a high vertical electrical field to induce electron tunneling effect that causes the injection of electrons toward the bulk from the floating gate 103 of the device and reduces its threshold voltage.

The bias condition is reversed in a repairing operation. As shown in FIG. 1(b), a positive high voltage is applied to the control gate 102 and the bulk 101 is grounded to inject electrons back to the floating gate 103. The channel erasing or repairing technique requires a relatively high voltage to be applied to the bulk 101 or the control gate 102 of the device in order to achieve a fast erasing or repairing speed.

The decoder circuitry of a memory array can be divided as an X-decoder circuit and a Y-decoder circuit. In a conventional flash memory, the X-decoder circuit usually provides the required high voltage to the word lines (connected to control gates) of the selected cells. The relatively high bias voltage requires that the X-decoder driver have high device breakdown voltage. This high breakdown voltage not only reduces the speed of reading the cells but also makes the x-decoder circuit difficult to shrink.

The conventional X-decoder puts all its PMOS devices in an N-well and NMOS devices in the same P-substrate of the memory array. When the X-decoder has to provide a positive high voltage, the high voltage is provided from the PMOS and the N-well is applied with a higher or equal voltage to maintain a reverse-biased diode condition of the PMOS device in order to prevent a forward current. The structure, however, is not efficient if a bias condition requires that both positive and negative high voltages be supplied to the word lines of the memory cells in the array.

Another technology called triple-well technology has also been used for the circuit structure of an X-decoder. In a triple-well circuit, the NMOS devices are formed in a P-well, the P-well is embedded in a deep N-well and the deep N-well is formed in a P-substrate. This technology makes it easier to apply a negative high voltage to selected word lines. When providing a negative high voltage, the NMOS devices as well as the embedded P-well are applied with negative high voltage and the deep N-well is grounded or connected to a power supply voltage VDD to maintain a reverse-biased diode condition.

The triple-well technology is not an efficient approach for providing both positive and negative high voltages at the same time either because of the strong constraint in the device breakdown voltage. When both positive and negative high voltages are required, the PMOS and N-well have to be connected to a positive high voltage and the NMOS and P-well have to be connected to a negative high voltage simultaneously. As a result, the absolute difference between the positive and negative high voltages can not exceed the device breakdown voltage to avoid damaging the device.

SUMMARY OF THE INVENTION

This invention has been made to overcome the above mentioned drawbacks of a conventional flash memory array. A primary object of the invention is to provide new bias conditions for erasing and repairing operation of the memory cells in a flash memory array. The bias condition for an erasing operation comprises connecting the bulk of the device to a positive high voltage and the control gate to a negative high voltage for inducing electron tunneling effect based on the principle of channel-erasing. The bias condition for a repairing operation supplies a negative high voltage to the bulk and a positive high voltage to the control gate. By means of applying both positive and negative high voltages, the breakdown voltage requirement of the peripheral X-decoder circuits can be relieved.

A second object of the present invention is to provide an X-decoder circuit that can supply appropriate voltages to the memory cells to support the bias conditions. According to this invention, two X-decoder circuit structures are presented for providing both positive high and negative high voltages to the memory cells. One structure allows efficient erasing or repairing of memory cells by blocks. The other can be used for erasing or repairing a small sector of memory cells.

In the first X-decoder circuit structure, the memory cells are fabricated in a common array well. The cells are divided into a plurality of memory blocks each having an X-decoder block for providing a positive or negative high voltage. Each X-decoder block, comprising an N-well and a P-well, is constructed in a separated X-decoder well. An X-decoder well is separated from other X-decoder wells as well as the common array well.

In an erasing operation, the common array well is provided with a positive high voltage, the word lines of a memory block to be erased are all provided with a negative high voltage, and the word lines of a memory block not selected for erasing are provided with a positive high voltage. The X-decoder block of a memory block never has to be connected to both positive and negative high voltages for an erasing operation. The requirement of a high device breakdown voltage is relieved.

In the second X-decoder circuit structure, each memory block is fabricated in a separated array well. Every memory block has a first word line connected to a first X-decoder block, a second word line connected to a second X-decoder block, . . . , and so on. The number of X-decoder blocks is the same as the number of word lines in each memory block. Each X-decoder block is constructed in a separated X-decoder well. Every word line in the memory array has its own X-decoder driver in one of the X-decoder block for providing a positive or negative high voltage. Therefore, a small number instead of a whole block of word lines of memory cells can be erased or repaired.

Another object of this invention is to provide a new layout approach for constructing the memory array and the X-decoder circuit of the invention. In the second X-decoder circuit, an X-decoder block comprises a large number of X-decoder drivers. The conventional layout in which the X-decoder circuit is located at the left or the right of its corresponding memory block has a limited space for the X-decoder circuit. The present invention provides a new layout in which the X-decoder is located at the top or the bottom of the memory array. Thus, more complex X-decoder circuits can be constructed.

DETAILED DESCRIPTION OF THE INVENTION

Figure 1:
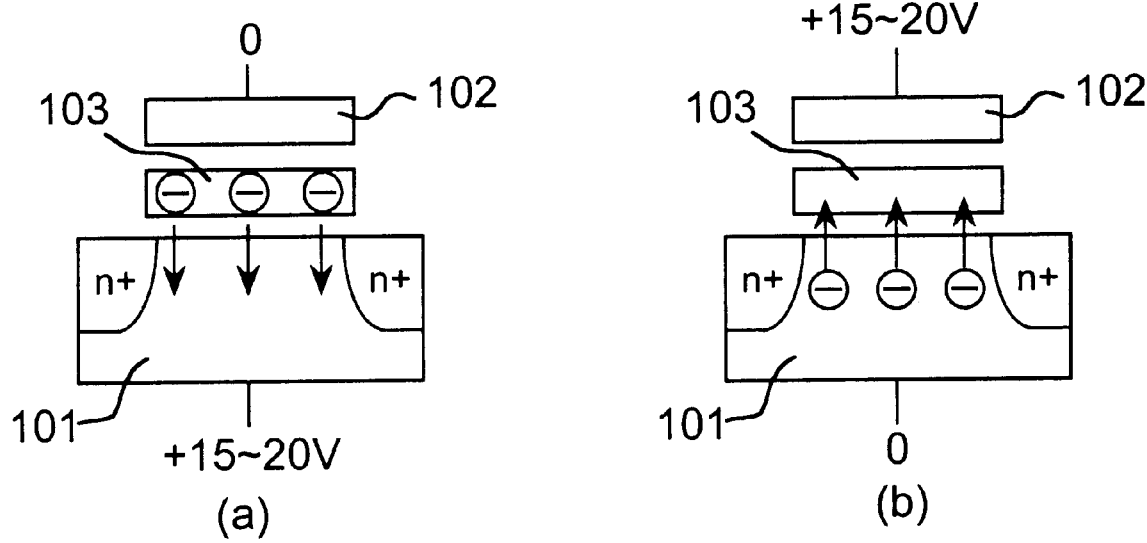
FIG. 1 shows the bias conditions for (a) erasing and (b) repairing operations of a conventional non-volatile memory cell using floating-gate technology.
Figure 2:
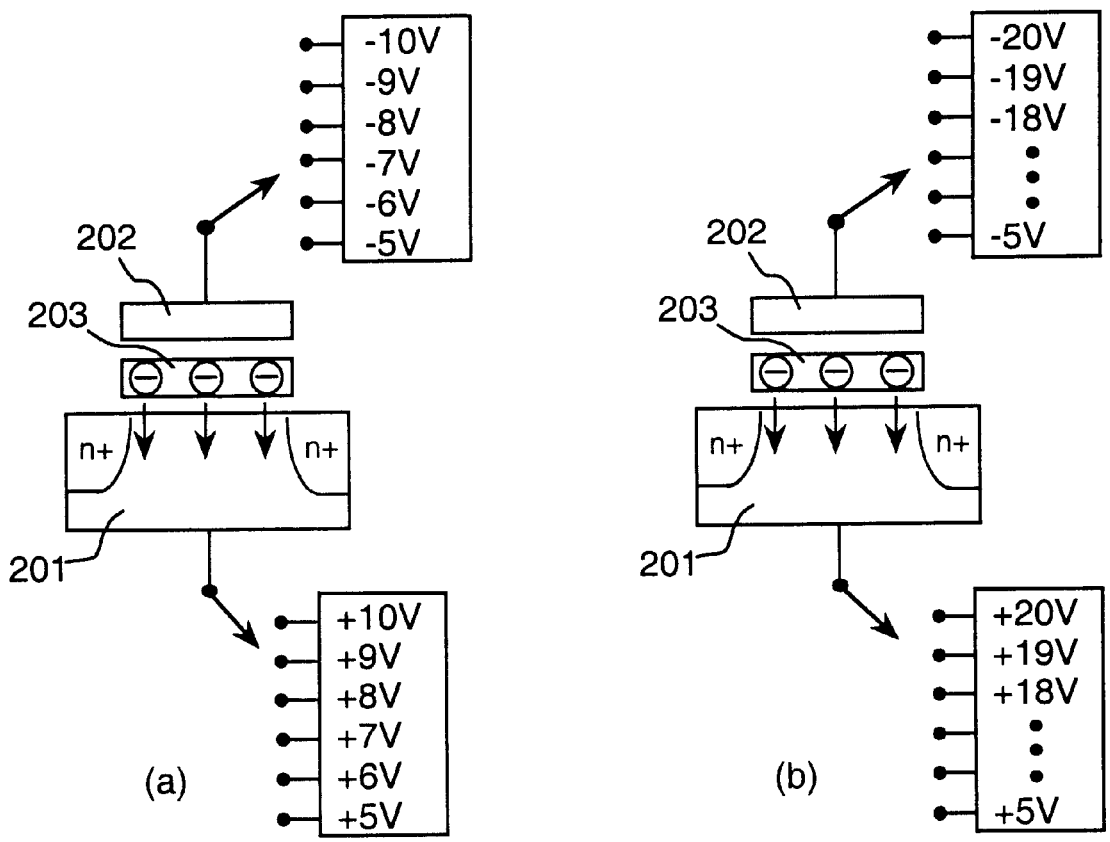
FIG. 2 shows the bias conditions of this invention for an erasing operation of a non-volatile memory cell using floating-gate technology for (a) a lower breakdown voltage, and (b) a higher speed of operation.

With reference to FIG. 2, a cross-sectional view of a memory cell is used to show the bias condition of this invention for a non-volatile memory cell such as a flash memory cell that uses floating gate technology. As seen in FIG. 2, in an erasing operation, a positive high voltage is applied to the bulk (substrate) 201 of the memory cell and a negative high voltage is applied to the control gate 202 of the cell. This erasing bias condition builds a sufficiently high vertical electric field to induce electron tunneling through the tunnel oxide of the device. The electrons are injected from the floating gate 203 toward the bulk 201 and hence decrease the threshold voltage. This results in channel-erasing.

In contrast to the bias condition of conventional channel-erasing, the negative high voltage applies to the control gate 202 reduces the level of the positive high voltage that has to be applied to the bulk 201 while still maintaining sufficient electric field for electron tunneling. In the conventional bias condition, a control gate is grounded and the positive high voltage applied to the bulk is very high which results in requiring a very high device breakdown voltage in the decoder circuit of the memory cell array and a slower memory read speed. By having both positive and negative high voltages in an erasing operation, the required device breakdown voltage is reduced by approximately one half.

Both the positive and negative high voltages described above for the bias condition may be selected from several different levels of voltages that are appropriate for erasing the memory cell. The selection can be based on the speed or breakdown voltage requirement. As an example, the positive high voltage may be one selected from a group of positive voltages in a range from 5V to 10V and the negative high voltage may be one selected from a group of negative voltages in a range from −5V to −10V. FIG. 2(a) illustrates the bias condition for an erasing operation that has the same speed as compared to a conventional bias condition but a lower breakdown voltage.

If it is desirable to have a higher speed of operation, the group of positive high voltages may be in a range from 5V to 20V and the group of negative high voltages may be in a range from −5V to −20V. As shown in FIG. 2(b), the applicable positive and negative high voltages have wider ranges compared to those of FIG. 2(a). This new bias condition has higher speed of operation and the same breakdown voltage as compared to a conventional bias condition.

Figure 3:
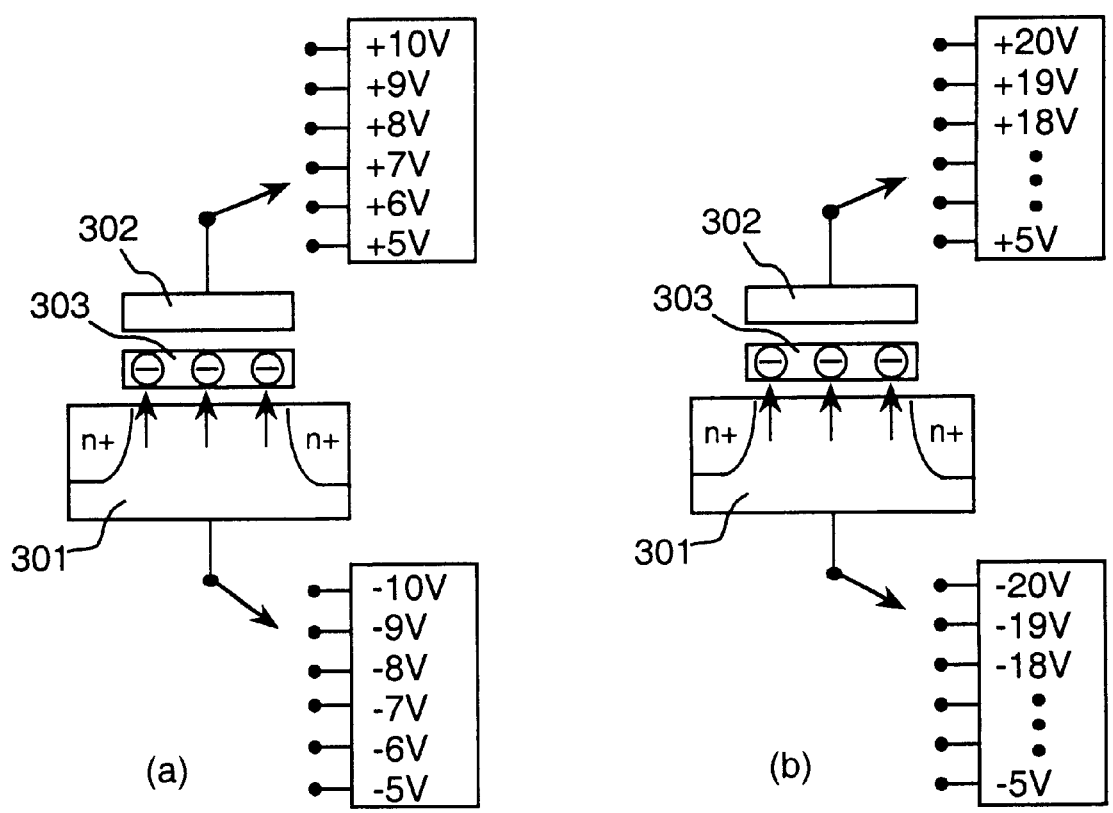
FIG. 3 shows the bias conditions of this invention for a repairing operation of a non-volatile memory cell using floating-gate technology for (a) a lower breakdown voltage, and (b) a higher speed of operation.

Similarly, as shown in FIG. 3 this invention provides a new bias condition for channel-repairing after an erasing operation. In contrast to being grounded in a conventional channel-repair, the bulk 301 of the memory cell is applied with a negative high voltage. The control gate 302 is applied with a positive high voltage. The bias condition causes the electrons to be injected from the bulk 301 of the cell toward the floating gate 303 and thus increasing the threshold voltage of the cell. For memory cells whose threshold voltages are over-erased, the channel-repairing bias condition of this invention can be used to repair their threshold voltages for overcoming the over-erasure problem.

The positive or negative high voltages for a repairing operation can also be selected from groups of positive or negative high voltages. For a lower breakdown voltage the positive high voltage can be in a range from 5V to 10V and the negative high voltage can be in a range from −5V to −10V. For a higher speed of operation, the ranges can be increased as 5V to 20V and 5V to −20V respectively. FIGS. 3(a) and 3(b) illustrate the bias conditions for a repairing operation.

An over-erased memory cell has a threshold voltage lower than a read inhibit voltage, which is typically the ground voltage, thus causing the memory cell to have leakage current during a read operation. By applying the bias condition of this invention to the control gates of the over-erased memory cells, electrons are injected back to the floating gate to repair the cells. If the repairing time is precisely controlled, the threshold voltage can be recovered to a desired positive level and to overcome the over-erasure problem. Using the bias condition of this invention, there is no channel current flowing between the source and drain of a memory cell during the repairing process. Therefore, a large number of memory cells can be repaired simultaneously without being concerned with the current supply capability of an on-chip voltage pump circuit.

In a flash memory array, the erasing speed of each memory cell on a word line may be different. For eliminating the over-erasure problem, the optimal biased voltage levels for erasing a word line may have to be variable dependent on the maximum threshold voltage of the memory cells in the word line. The optimal positive and negative high voltage levels can be determined by detecting the maximum threshold voltage.

Similarly, for a repairing operation, the optimal positive and negative high voltage levels can by dependent on the minimum threshold voltage of the memory cells on the word lines to be repaired. Therefore, one of the embodiments of this invention is to make the positive and negative high voltages dependent on the detected threshold voltage.

Figure 4:
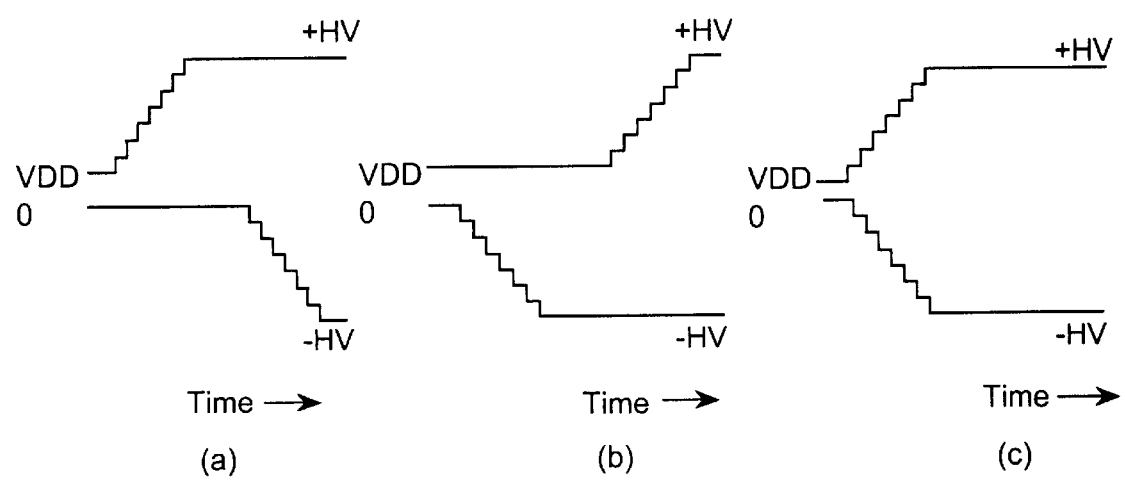
FIG. 4 shows three different ways of ramping up and down the positive and negative high voltages for the bias conditions of this invention, i.e., (a) ramping up the positive voltage first, (b) ramping down the negative voltage first, and (c) ramping up the positive voltage and ramping down the negative voltage simultaneously.

Furthermore, in order to reduce the stress to memory cells, the supplied positive or negative high voltage may also be gradually ramped up or down from a lower voltage level to a higher voltage level. FIG. 4 shows how the voltages can be ramped up or down. In FIG. 4(a), the positive high voltage is first ramped up by maintaining the negative voltage at a low level such as the ground voltage. In FIG. 4(b), the negative high voltage is ramped down first. In FIG. 4(c) both positive and negative high voltages are ramped up and down respectively at the same time. Each method has its own advantage. Which method to use depends on the application and the circuit environment.

To support the bias conditions as described above, this invention also provides a new decoder circuit for a memory array. This new decoder circuit significantly reduces the breakdown voltage requirement of the devices in the decoder. As described in the background of the invention, although technologies such as triple-well have been used in a conventional flash memory array to reduce a breakdown voltage, they are not efficient in providing both positive and negative high voltages as required in the bias conditions of this invention.

According to this invention, the P-Well and N-Well of the X-decoder are separated. This circuit design technology is named "separated-well" technology. For the word lines that require a positive high voltage, the P-wells and PMOS devices of their corresponding X-decoder drivers are connected to the positive high voltage and the N-wells and NMOS devices are connected to the ground. Similarly, for those word lines that require a negative high voltage, the N-wells and NMOS devices of their X-decoder are connected to the negative high voltage and the P-wells and PMOS devices are connected to either ground or a power supply voltage $V_{DD}$.

By having both positive and negative high voltages, the requirement in the breakdown voltage of the devices in the X-decoder can be greatly reduced. The arrangement of this invention reduces the X-decoder breakdown voltage requirement by approximately one half. It also has the advantage of higher speeds in erasing and repairing the memory cell array.

In a conventional flash memory, a large block of memory cells are erased or repaired at a time. In order to provide more flexibility to a flash memory array, an advanced flash memory array typically has a few blocks of memory cells in which a portion such as a sector of word lines can be erased or repaired at one time without having to erase or repair the whole block. The separated-well technology of this invention also provides different designs of the X-decoder circuit as described in the following sections to accomplish this flexibility.

Figure 5:
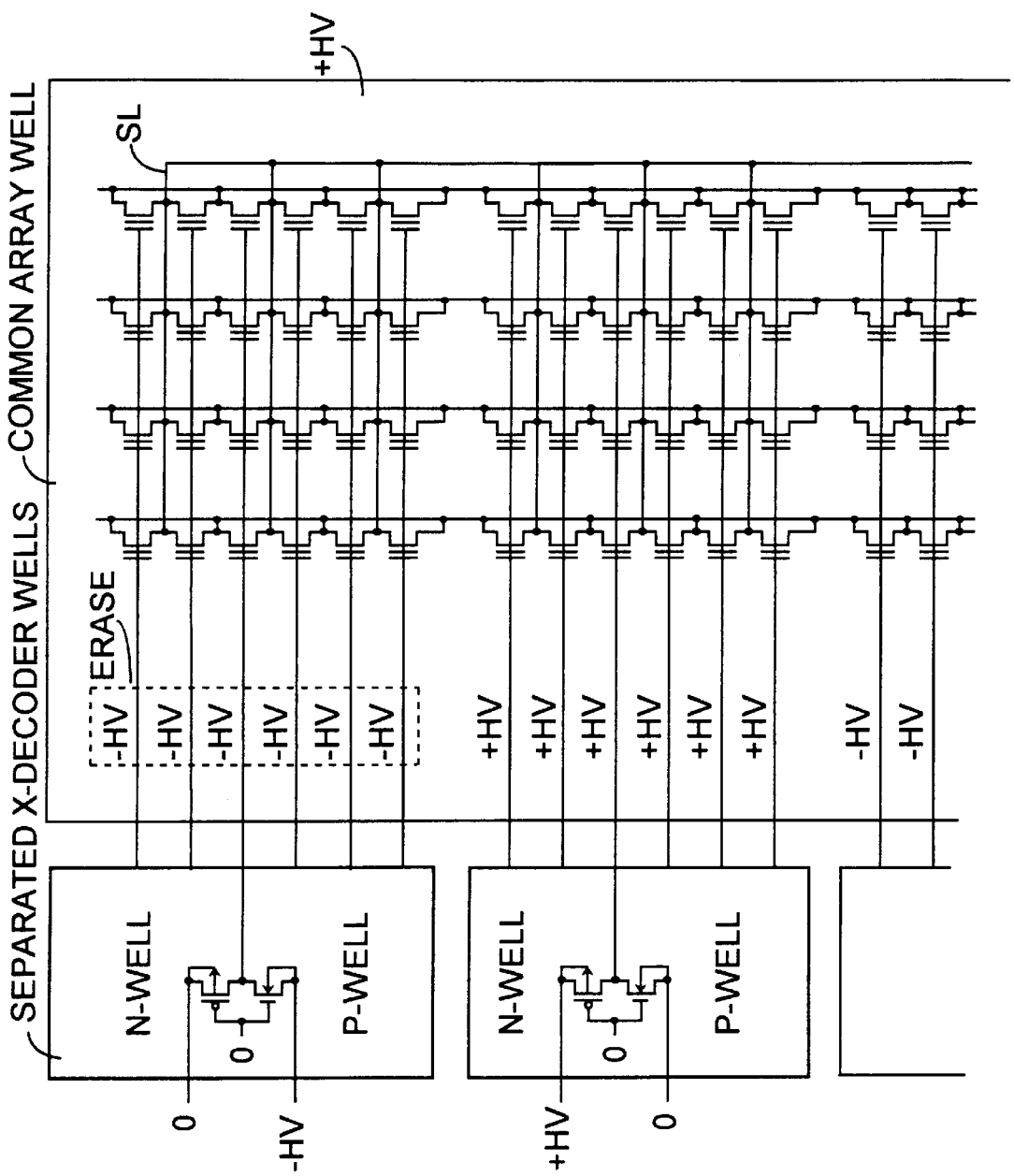
FIG. 5 shows a circuit structure of a NOR-plane flash memory array in which the X-decoder circuit has separated X-decoder wells for providing the bias condition of this invention.

FIG. 5 shows the circuit structure and the bias condition for a separated-well X-decoder and memory cells of the present invention during an erasing operation. As shown in the figure, all the N-channel cells in the NOR-plane memory array are located and fabricated in a common array P-well that is applied with a positive high voltage. The X-decoder driver provides a negative high voltage to all the word lines in a block that is to be erased. Each X-decoder driver of one block has separated N-well and P-well for its own PMOS and NMOS devices respectively. Therefore, the wells can be supplied with appropriate voltages independent of the X-decoder driver of other blocks.

As indicated in FIG. 5, the P-well and N-well of an X-decoder driver of a block to be erased are applied with a negative high voltage and a ground voltage (0 volt) respectively so that the word lines of the block are applied with a negative high voltage. The P-well and N-well of an X-decoder driver of a block that is not to be erased are applied with a ground voltage and a positive high voltage respectively. In addition, the same voltage provided to the well of each X-decoder is also provided to the power lines of the X-decoder driver. By supplying both the voltages of wells and power lines of the X-decoder driver of each block separately, none of the X-decoder drivers would receive both positive and negative high voltages together at the same time even though some word lines are applied a positive high voltage and some are applied a negative high voltage by the X-decoders at the same time.

During a repairing operation, the common P-well is applied with a negative high voltage instead of a positive high voltage. The word lines of a block to be repaired are supplied with a positive high voltage by applying a positive high voltage and a ground voltage to the N-well and P-well of the X-decoder driver of the block respectively. The word lines that are not to be repaired are applied with an appropriate negative high voltage to eliminate the bulk disturbance during a repairing operation.

Although the circuit structure and design of X-decoders just described are efficient in erasing and repairing a large block of memory cells, the circuit area required is very large if the block size of erasing or repairing is as small as a word line. Therefore, this invention provides a different circuit structure and design for dealing with small sector erasing and repairing.

Figure 6:
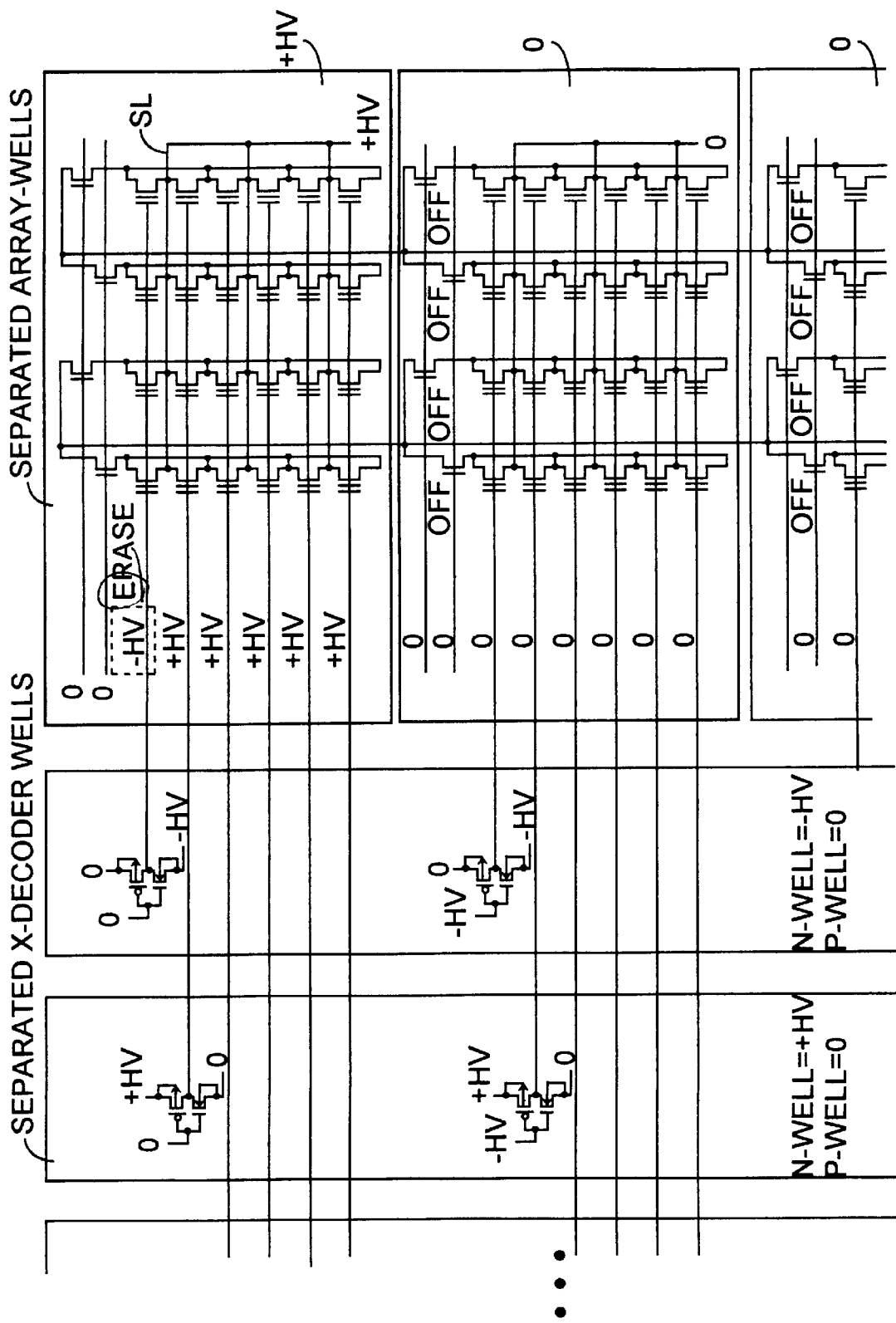
FIG. 6 shows another circuit structure of the flash memory array in which the X-decoder circuit has an alternative design of separated X-decoder wells for providing the bias condition of this invention.

With reference to FIG. 6, the X-decoder driver also has separated P-well and N-well. In FIG. 5, the memory cell array is fabricated in a common array P-well and the driver of the X-decoder for a same block is fabricated in a separated X-decoder well to provide the same negative or positive high voltage to all the word lines of the block. The design provides very efficient block erasing or repairing. In FIG. 6, however, the memory cell array has a separated array P-well for each memory block and the drivers to the word lines of a same block are fabricated in different and separated X-decoder wells instead of a same separated X-decoder well.

During an erasing operation, only the array P-well of a memory block that has at least one word line to be erased is applied with a positive high voltage and the other array P-wells are grounded. The voltage applied to each word line in a same memory block can be separately controlled. As shown in FIG. 6, the drivers to the corresponding word lines of all blocks having small sector erasing capability are fabricated in the same separated X-decoder well. In other words, a first separated X-decoder well is used to fabricate the drivers to the first word lines of all memory blocks and a second separated X-decoder well is used to fabricate the drivers to the second word lines of all memory blocks and so forth.

For example, if only the first word line of the first memory block shown on top of FIG. 6 is to be erased, the N-well and P-well in the first separated X-decoder well are applied with a negative high voltage and a ground voltage respectively. The N-wells and P-wells of other separated X-decoder wells are applied with a positive high voltage and a ground voltage respectively. The driver corresponding to the first word line of the first memory block, therefore, provides a negative high voltage to the word line. The other word lines in the first block are applied with a positive high voltage.

Because the separated array P-wells of other memory blocks are grounded and their word lines are also grounded, no memory cell is disturbed by the high positive P-well voltage of the erased block. Furthermore, by properly providing the voltage to the N-well and P-well of each separated X-decoder well, any word line in the first memory block can be selected for erasing. As a result, the circuit design and structure of FIG. 6 make it possible to erase any number of word lines in the first block while other blocks are grounded.

Figure 7:
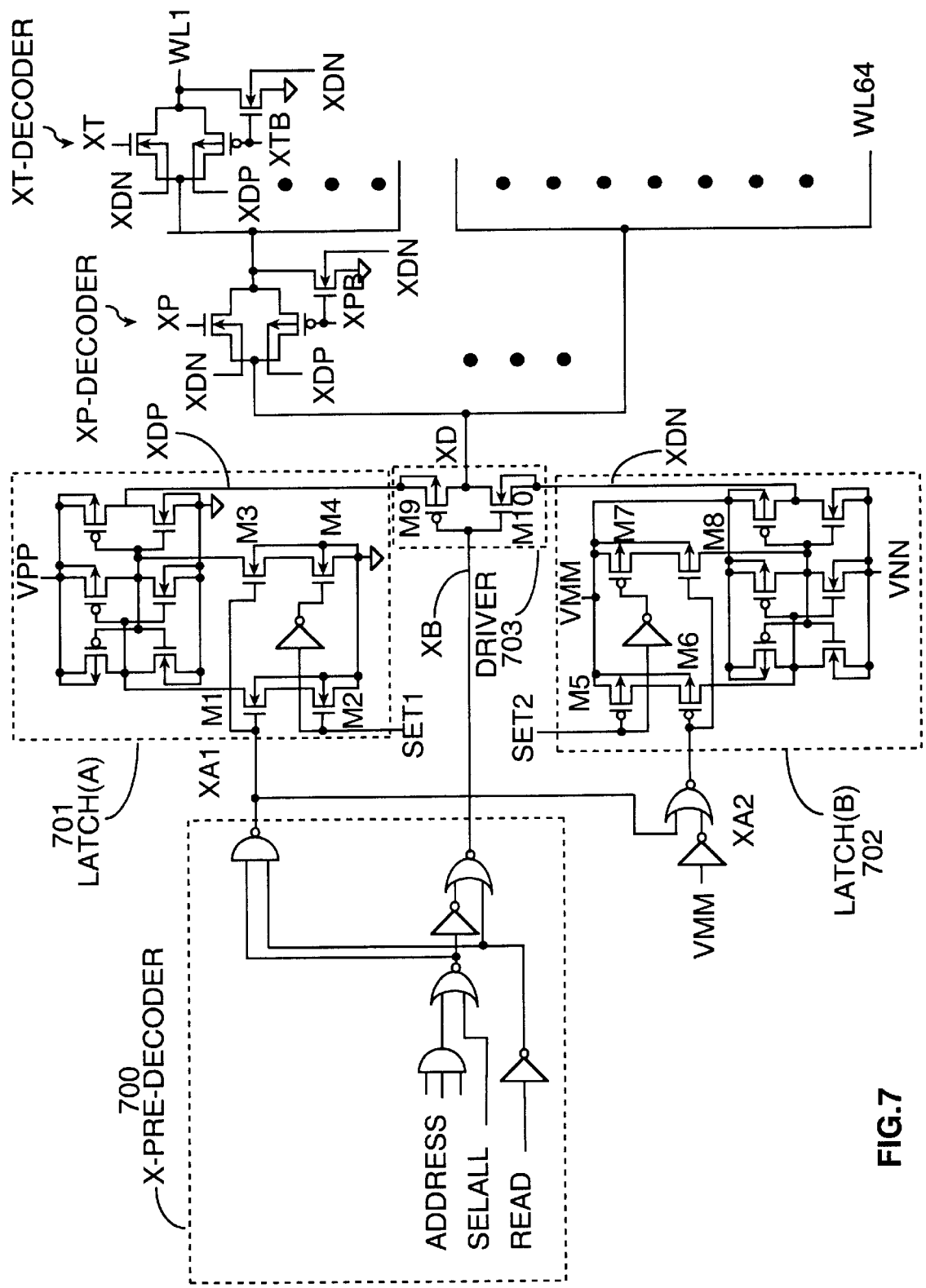
FIG. 7 shows the detailed circuit of an X-decoder driver of this invention.

FIG. 7 shows an example of the implementation of the X-decoder circuit of this invention for a block of memory cells. The X-decoder driver as shown can be used in the X-decoder structure for block erasing or small sector erasing. The X-decoder circuit comprises two latches, latch A 701 and latch B 702, as well as an X-decoder driver 703. The two latches receive input signals XA1, XA2, SET1 and SET2 from an X-pre-decoder 700, and output proper voltage levels to the driver according to the states stored in the latches.

To provide a positive high voltage $V_{PP}$ to the driver XD, the latch A outputs $V_{PP}$ to XDP and the latch B outputs the ground voltage to XDN. By grounding XB, $V_{PP}$ is passed to XD through a transistor M9. To provide a negative high voltage $V_{NN}$ to XD, the latch B outputs $V_{NN}$ to XDN and the latch A outputs the ground voltage to XDP. Similarly, by grounding XB, $V_{NN}$ can be passed to XD through a transistor M10. Because latch A and latch B output different voltages to the driver for different XD outputs, they prevent the driver from receiving $V_{PP}$ and $V_{NN}$ simultaneously and, hence, the maximum voltage to the driver is limited to either $V_{PP}$ or $V_{NN}$.

The latch A can output either the positive high voltage $V_{PP}$ or the ground voltage to XDP according to its latched state. The state of the latch A is set by transistors M1, M2, M3, M4 and signals XA1 and SET1. SET1 signal controls the state written to the latch A. When SET1 is high, the output of the latch A, XDP, goes low. When SET1 is low, the output XDP goes high. XA1 signal is sent from the X-pre-decoder 700. When the associated memory block is selected, XA1 goes high and transistors M1 and M3 are turned on to set latch A according to the signal SET1. In other memory blocks that are not selected, their corresponding XA1 signals remain low to prevent the states of their latches A from being overwritten.

Because of the latch circuits, a plurality of the latches A can be set to high. These latches apply positive high voltage $V_{PP}$ to their XD simultaneously, resulting in parallel repairing of the plurality of blocks. To set a plurality of latches A to high, a two-step procedure is required. The first step is to set all the latches A to low by setting the input SELALL to high to turn on the transistors M1 and M3 of all blocks. The signal SET1 is also set to high so the outputs of all the latches A are set to low. The second step resets the latch A of the selected word line to high by setting the input signal SELALL to low to make the selected XA1 high and set the selected latch A. The signal SET1 is changed from high to low to reset the selected latch A to high. To perform multiple-block repairing at the same time, the second step can be repeated until a plurality of latches A are set to high so that the word lines in a plurality of blocks can be applied with the positive high voltage Vpp.

The operation of the latch B is similar to that of the latch A. The latch B can output the negative high voltage $V_{NN}$ or $V_{MM}$ to XDN according to the latched state. The state of the latch B is set by signals XA2 and SET2. The signal level of SET2 is complementary to that of SET1. Therefore, when XA1 is set to high to turn on transistors M1 and M3, XA2 must be low to turn on transistors M6 and M8 simultaneously. This makes the latches A and B of a selected memory block set simultaneously and their voltages match each other.

In an erasing operation, both latches A and B are set to the same logic level. To provide the positive high voltage $V_{PP}$, both latches are set to high so that the latch A outputs $V_{PP}$ and the latch B outputs the ground voltage. Therefore, $V_{PP}$ is passed through the driver 703 to XD. Similarly, to provide the negative high voltage $V_{NN}$, both latches are set to low so that the latch B outputs $V_{NN}$ and the latch A outputs the ground voltage. $V_{NN}$ is thus passed through the driver 703 to XD. The arrangement of the X-decoder circuit as described above never applies a voltage level higher than either $V_{PP}$ or $V_{NN}$ to a device at any time.

With reference to FIG. 7, the XD signal is passed to the selected word lines through two level decoders, XP-decoder and XT-decoder. For a large block erasing/repairing operation, the signal XB and signals XP, XPB, XT and XTB are all grounded to pass either $V_{PP}$ or $V_{NN}$ to all the word lines in the selected block to repair, erase, or inhibit all the word lines in the block. For a small sector erasing/repairing operation, the selected signals of XP, XPB, XT and XTB are grounded, and thus the non-selected signals are applied with either negative or positive high voltages to shut off the transistors dependent on the XD signal's voltage.

If XD is provided with the voltage of $V_{PP}$, the non-selected XP and XT have the ground voltage and the non-selected XPB and XTB have the voltage of $V_{PP}$. If XD is provided with the voltage of VNN, the non-selected XP and XT have the voltage of $V_{NN}$ and the non-selected XPB and XTB have the ground voltage. Therefore, the voltage at XD will be passed to the selected word lines and the ground voltage passed to the non-selected word lines as described earlier.

In the embodiment of this invention, all the PMOS devices of the XD driver, XP-decoder and XT-decoder are fabricated within an N-well that is connected to the signal XDP. Similarly, all the NMOS devices of the XD driver, XP-decoder and XT-decoder are located within a P-well that is connected to the signal XDN. Because $V_{PP}$ and $V_{NN}$ are not applied to XDP and XDN of one block at the same time, the junction-to-well voltage does not exceed $V_{PP}$ or $V_{NN}$. The damage to the devices due to high breakdown voltage is avoided.

As mentioned above, the operation of the latch B is similar to that of the latch A except for the voltage $V_{MM}$. When the state of the latch B is set or reset, $V_{MM}$ has the power supply voltage $V_{DD}$ because the input signal SET2 and XA2 are at $V_{DD}$ level. However, during repairing and erasing operation, $V_{MM}$ is grounded while $V_{NN}$ is a negative high voltage. This voltage change of $V_{MM}$ is to reduce the maximum voltage of transistors M5, M6, M7 and M8. By lowering $V_{MM}$ from $V_{DD}$ to the ground, the maximum voltage is limited to $V_{NN}$ instead of the sum of $|V_{NN}|$ and $V_{DD}$, where $|V_{NN}|$ is the magnitude of $V_{NN}$. For the same consideration, when VmM is grounded, it also forces XA2 to be grounded.

During a reading operation, the state of the latch A is fixed at a high level and the state of the latch B is at a low level. $V_{PP}$ is fixed at $V_{DD}$ and $V_{NN}$ is fixed at ground. Under this configuration, the latch A applies $V_{DD}$ to XDP and the latch B provides the ground voltage to XDN constantly. The XD driver 703 becomes a normal inverter. Therefore, the selected word line can be directly driven by the input signal XB of the driver 703. To accomplish this, a signal READ as shown in FIG. 7 is set to high, which enables XA1 to high and XA2 to low, to always turn on transistors Ml, M3, M6 and M8. SET1 and SET2 are set at low and high respectively. Therefore, XDP is always pulled up to $V_{DD}$ and XDN is pulled down to ground. XB signal is set to ground voltage constantly during repairing and erasing operation. In a reading operation, it is selected by the X-pre-decoder. The selected XB signal goes low to pass $V_{DD}$ to the XD signal of the selected block while the non-selected XB goes high to pass ground voltage to the XD of the non-selected blocks.

In a conventional layout, a flash memory array has a plurality of bit lines running in a vertical direction and a plurality of word lines running in a horizontal direction. The X-decoder is located at either the right or the left of the memory array, vertical to the running direction of word lines and connecting to the end of each word line. The vertical extension of the X-decoder is therefore limited to that of the memory array. Consequently, the X-decoder circuit must be as simple as possible to fit into a word line pitch.

As described in the previous sections and shown in FIG. 6, in order to provide small sector erasing or repairing, the drivers to the corresponding word lines of all blocks having small sector erasing capability are fabricated in the same separated X-decoder well and each word line has its own X-decoder driver. Because of the complexity of the X-decoder circuit as discussed earlier, the layout of the X-decoder requires significant extension in the vertical direction and may be difficult to fit into an area having the same vertical extension as the memory array.

This invention provides a new layout in which the X-decoder circuit is located at either the top or the bottom of the memory array and in parallel with the running direction of the word lines. The output lines of the X-decoder circuit first extend vertically and then turn horizontally for connecting to the word lines. The connection can be achieved by any conductive material available in the fabrication processes, such as the second metal layer, the third metal layer of the third polysilicon layer, when the connection is being laid out.

Figure 8:
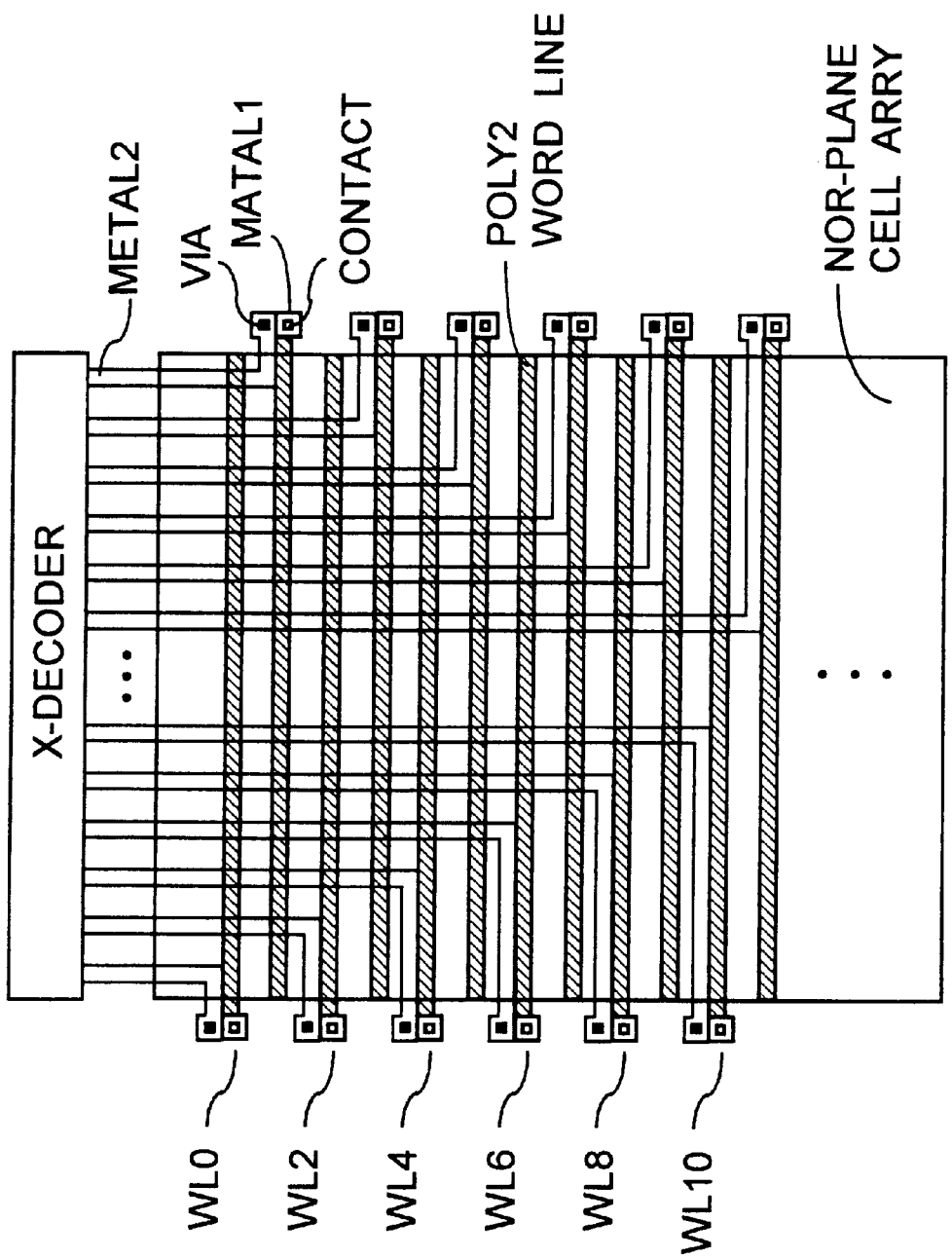
FIG. 8 shows the layout of this invention for the X-decoder circuit of a flash memory array.

FIG. 8 shows an example of the layout of this invention, the X-decoder is located at the top of the memory array. In the example, it is assumed that the bit lines are formed by the first metal layer and the outputs of the X-decoder are connected to the word lines by means of metal lines formed by the second metal layer. As illustrated in FIG. 8, a second layer metal line is connected through a via to a first metal layer and then a contact hole to a second polysilicon layer word line. This new layout approach eliminates the constraint of a word line pitch, thus allowing the layout of a more complex X-decoder circuit.

What is claimed is:

1. A method for erasing a non-volatile memory cell in a flash memory array, said memory cell having a control gate, a floating gate and a substrate, comprising applying a negative high voltage to the control gate and a positive high voltage to the substrate for establishing a sufficiently high electric field to induce electron tunneling effect from the floating gate to the substrate.

2. The method for erasing a non-volatile memory cell according to claim 1, wherein said negative and positive high voltages are determined by detecting the maximum threshold voltages of the non-volatile memory cells in said flash memory array.

3. The method for erasing a non-volatile memory cell according to claim 1, wherein applying the negative high voltage to the control gate is accomplished by maintaining a positive low voltage at the substrate and gradually ramping down a less negative voltage to the level of the negative high voltage, and applying the positive high voltage to the substrate is accomplished by gradually ramping up the positive low voltage to the level of the positive high voltage after the control gate has been applied with the negative high voltage.

4. The method for erasing a non-volatile memory cell according to claim 1, wherein applying the positive high voltage to the substrate is accomplished by maintaining a negative low voltage at the control gate and gradually ramping up a less positive voltage to the level of the positive high voltage, and applying the negative high voltage to the control gate is accomplished by gradually ramping down the negative low voltage to the level of the negative high voltage after the substrate has been applied with the positive high voltage.

5. The method for erasing a non-volatile memory cell according to claim 1, wherein applying the negative high voltage to the control gate and applying the positive high voltage to the substrate are accomplished by gradually ramping down a less negative voltage at the control gate to the level of the negative high voltage and gradually ramping up a less positive voltage at the substrate to the level of the positive high voltage at the same time.

6. The method for erasing a non-volatile memory cell according to claim 1, wherein said negative high voltage is selected from a group of negative voltages in a range from –5V to –10V, and said positive high voltage is selected from a group of positive voltages in a range from 5V to 10V.

7. The method for erasing a non-volatile memory cell according to claim 1, wherein said negative high voltage is selected from a group of negative voltages in a range from –5V to –20V, and said positive high voltage is selected from a group of positive voltages in a range from 5V to 20V.

8. A method for repairing the threshold voltage of a non-volatile memory cell in a flash memory array, said memory cell having a control gate, a floating gate and a substrate, comprising applying a positive high voltage to the control gate and a negative high voltage to the substrate for establishing a sufficiently high electric field to inject electrons from the substrate to the floating gate.

9. The method for repairing the threshold voltage of a non-volatile memory cell according to claim 8, wherein said positive and negative high voltages are determined by detecting the minimum threshold voltage of the non-volatile memory cells in said flash memory array.

10. The method for repairing the threshold voltage of a non-volatile memory cell according to claim 8, wherein applying the positive high voltage to the control gate is accomplished by maintaining a negative low voltage at the substrate and gradually ramping up a less positive voltage to the level of the positive high voltage, and applying the negative high voltage to the substrate is accomplished by gradually ramping down the negative low voltage to the level of the negative high voltage after the control gate has been applied with the positive high voltage.

11. The method for repairing the threshold voltage of a non-volatile memory cell according to claim 8, wherein applying the negative high voltage to the substrate is accomplished by maintaining a positive low voltage at the control gate and gradually ramping down a less negative voltage to the level of the negative high voltage, and applying the positive high voltage to the control gate is accomplished by gradually ramping up the positive low voltage to the level of the positive high voltage after the substrate has been applied with the negative high voltage.

12. The method for repairing the threshold voltage of a non-volatile memory cell according to claim 8, wherein applying the positive high voltage to the control gate and applying the negative high voltage to the substrate are accomplished by gradually ramping up a less positive voltage at the control gate to the level of the positive high voltage and gradually ramping down a less negative voltage at the substrate to the level of the negative high voltage at the same time.

13. The method for repairing the threshold voltage of a non-volatile memory cell according to claim 8, wherein said positive high voltage is selected from a group of positive voltages in a range from 5V to 10V, and said negative high voltage is selected from a group of negative voltages in a range from −5V to −10V.

14. The method for repairing the threshold voltage of a non-volatile memory cell according to claim 8, wherein said positive high voltage is selected from a group of positive voltages in a range from 5V to 20V, and said negative high voltage is selected from a group of negative voltages in a range from −5V to −20V.

15. A flash memory array circuit comprising:
an array of memory cells divided into a plurality of memory blocks each having a plurality of word lines, said memory cells being fabricated in a common array well on a device substrate; and an X-decoder circuit comprising a plurality of X-decoder blocks corresponding to said memory blocks, each X-decoder block being fabricated in an X-decoder well comprising an N-well and a P-well for providing a positive high voltage or a negative high voltage to the word lines of a memory block, said X-decoder well being separated from other X-decoder wells and said common array well.

16. The flash memory array circuit according to claim 15, further comprising a first bias condition for an erasing operation, said first bias condition including applying a first negative high voltage to the word lines of memory blocks selected for erasing, a first positive high voltage to said common array well, and a second positive high voltage to the word lines of memory blocks not selected for erasing; and a second bias condition for a repairing operation, said second bias condition including applying a third positive high voltage to the word lines of memory blocks selected for repairing, a second negative high voltage to said common array well, and a third negative high voltage to the word lines of memory blocks not selected for repairing.

17. The flash memory array circuit according to claim 16, wherein said first negative high voltage and said first positive high voltage in said first bias condition are determined by detecting the maximum threshold voltage of the memory cells on the word lines selected for erasing, and said third positive high voltage and said second negative high voltage in said second bias condition are determined by detecting the minimum threshold voltage of the memory cells on the word lines selected for repairing.

18. The flash memory array circuit according to claim 16, wherein said first negative high voltage and said first positive high voltage in said first bias condition are achieved by maintaining a positive low voltage at said common array well and gradually ramping down a less negative voltage to the level of said first negative high voltage at the word lines selected for erasing, and then gradually ramping up the positive low voltage to the level of said first positive high voltage.

19. The flash memory array circuit according to claim 16, wherein said first negative high voltage and said first positive high voltage in said first bias condition are achieved by maintaining a negative low voltage at said word lines selected for erasing and gradually ramping up a less positive voltage to the level of said first positive high voltage at said common array well, and then gradually ramping down the negative low voltage to the level of said first negative high voltage.

20. The flash memory array circuit according to claim 16, wherein said first negative high voltage and said first positive high voltage in said first bias condition are achieved by gradually ramping down a less negative voltage to the level of said first negative high voltage at the word lines selected for erasing, and gradually ramping up a less positive voltage to the level of said first positive high voltage at said common array well simultaneously.

21. The flash memory array circuit according to claim 16, wherein said third positive high voltage and said second negative high voltage in said second bias condition are achieved by maintaining a negative low voltage at said common array well and gradually ramping up a less positive voltage to the level of said third positive high voltage at the word lines selected for repairing, and then gradually ramping down the negative low voltage to the level of said second negative high voltage.

22. The flash memory array circuit according to claim 16, wherein said third positive high voltage and said second negative high voltage in said second bias condition are achieved by maintaining a positive low voltage at the word lines selected for repairing and gradually ramping down a less negative voltage to the level of said second negative high voltage at said common array well, and then gradually ramping up the positive low voltage to the level of said third positive high voltage.

23. The flash memory array circuit according to claim 16, wherein said third positive high voltage and said second negative high voltage in said second bias condition are achieved by gradually ramping up a less positive voltage to the level of said third positive high voltage at the word lines selected for repairing, and gradually ramping down a less negative voltage to the level of said second negative high voltage at said common array well simultaneously.

24. The flash memory array circuit according to claim 16, wherein said first, second and third positive high voltages are selected from a group of positive voltages in a range from 5V to 10V, and said first, second and third negative voltages are selected from a group of negative voltages in a range from −5V to −10V.

25. The flash memory array circuit according to claim 16, wherein said first, second and third positive high voltages are selected from a group of positive voltages in a range from 5V to 20V, and said first, second and third negative voltages are selected from a group of negative voltages in a range from −5V to −20V.

26. A flash memory array circuit comprising:
an array of memory cells divided into a plurality of memory blocks each having first, second, . . . , and Nth word lines and the memory cells of each memory block being fabricated in an array well, said array well being separated from other array wells in a device substrate; and an X-decoder circuit comprising a first X-decoder block having a plurality of X-decoder drivers each connecting to the first word line of a memory block, a second X-decoder block having a plurality of X-decoder drivers each connecting to the second word line of a memory block, . . . , and an Nth X-decoder block having a plurality of X-decoder drivers each connecting to the Nth word line of a memory block;

wherein each X-decoder block is fabricated in an X-decoder well which is separated from array wells and other X-decoder wells, and each X-decoder driver comprises an N-well and a P-well for providing a positive high voltage or a negative high voltage to a word line of a memory block.

27. The flash memory array according to claim 26, further comprising:

a first bias condition for an erasing operation, said first bias condition including applying a first positive high voltage to the array well of an erased memory block having at least a word line to be erased, applying a first negative high voltage to each word line to be erased in the erased memory block, a second positive high voltage to the word lines not selected for erasing in the erased memory block, and a ground voltage to the array well and all the word lines of a memory block having no word lines to be erased;

a second bias condition for a repairing operation, said second bias condition including applying a second negative high voltage to the array well of a repaired memory block having at least a word line to be repaired, applying a third positive high voltage to each word line to be repaired in the repaired memory block, a third negative high voltage to the word lines not selected for repairing in the repaired memory block, and a ground voltage to the array well and all the word lines of a memory block having no word lines to be repaired.

28. The flash memory array circuit according to claim 27, wherein said first negative high voltage and said first positive high voltage in said first bias condition are determined by detecting the maximum threshold voltage of the memory cells on the word lines selected for erasing, and said third positive high voltage and said second negative high voltage in said second bias condition are determined by detecting the minimum threshold voltage of the memory cells on the word lines selected for repairing.

29. The flash memory array circuit according to claim 27, wherein said first negative high voltage and said first positive high voltage in said first bias condition are achieved by maintaining a positive low voltage at the array well of an erased memory block having at least a word line to be erased and gradually ramping down a less negative voltage to the level of said first negative high voltage at the word lines selected for erasing, and then gradually ramping up the positive low voltage to the level of said first positive high voltage.

30. The flash memory array circuit according to claim 27, wherein said first negative high voltage and said first positive high voltage in said first bias condition are achieved by maintaining a negative low voltage at said word lines selected for erasing and gradually ramping up a less positive voltage to the level of said first positive high voltage at the array well of an erased memory block having at least a word line to be erased, and then gradually ramping down the negative low voltage to the level of said first negative high voltage.

31. The flash memory array circuit according to claim 27, wherein said first negative high voltage and said first positive high voltage in said first bias condition are achieved by gradually ramping down a less negative voltage to the level of said first negative high voltage at the word lines selected for erasing, and simultaneously gradually ramping up a less positive voltage to the level of said first positive high voltage at the array well of an erased memory block having at least a word line to be erased.

32. The flash memory array circuit according to claim 27, wherein said third positive high voltage and said second negative high voltage in said second bias condition are achieved by maintaining a negative low voltage at the array well of a repaired memory block having at least a word line to be repaired and gradually ramping up a less positive voltage to the level of said third positive high voltage at the word lines selected for repairing, and then gradually ramping down the negative low voltage to the level of said second negative high voltage.

33. The flash memory array circuit according to claim 27, wherein said third positive high voltage and said second negative high voltage in said second bias condition are achieved by maintaining a positive low voltage at the word lines selected for repairing and gradually ramping down a less negative voltage to the level of said second negative high voltage at the array well of a repaired memory block having at least a word line to be repaired, and then gradually ramping up the positive low voltage to the level of said third positive high voltage.

34. The flash memory array circuit according to claim 27, wherein said third positive high voltage and said second negative high voltage in said second bias condition are achieved by gradually ramping up a less positive voltage to the level of said third positive high voltage at the word lines selected for repairing, and simultaneously gradually ramping down a less negative voltage to the level of said second negative high voltage at the array well of a repaired memory block having at least a word line to be repaired.

35. The flash memory array circuit according to claim 27, wherein said first, second and third positive high voltages are selected from a group of positive voltages in a range from 5V to 10V, and said first, second and third negative voltages are selected from a group of negative voltages in a range from −5V to −10V.

36. The flash memory array circuit according to claim 27, wherein said first, second and third positive high voltages are selected from a group of positive voltages in a range from 5V to 20V, and said first, second and third negative voltages are selected from a group of negative voltages in a range from −5V to −20V.

37. A layout structure of a flash memory array circuit comprising:

a memory area having a plurality of memory cells;

a plurality of bit lines of said memory cells running in a vertical direction of said memory area;

a plurality of word lines of said memory cells running in a horizontal direction of said memory area; and an X-decoder circuit located at an X-decoder area above or below said memory area, said X-decoder area being substantially on a same plane as said memory area and running in a horizontal direction in parallel with said word lines;

wherein said X-decoder circuit comprises a plurality of driver lines being extended out from said X-decoder area and distributed on top of said memory area for connecting to said word lines by means of contact holes, vias or other conducting layers at the ends of said word lines.

* * * * *